United States Patent [19]
Schaefer et al.

[11] Patent Number: 5,943,571
[45] Date of Patent: Aug. 24, 1999

[54] METHOD FOR MANUFACTURING FINE STRUCTURES

[75] Inventors: Herbert Schaefer, Hoehenkirchen-Sieg.Brunn; Martin Franosch, Munich; Reinhard Stengl, Stadtbergen; Volker Lehmann, Munich; Hans Reisinger, Gruenwald; Hermann Wendt, Grassbrunn, all of Germany

[73] Assignee: Siemens Aktiengesellschaft, Munich, Germany

[21] Appl. No.: 08/883,571

[22] Filed: Jun. 26, 1997

[30] Foreign Application Priority Data

Aug. 14, 1996 [DE] Germany ........................... 196 32 834

[51] Int. Cl.$^6$ .................................................. H01L 21/336
[52] U.S. Cl. ........................ 438/257; 117/102; 117/923; 117/925; 438/257; 438/700; 438/706; 438/719
[58] Field of Search .................................. 117/102, 923, 117/925; 438/257, 700, 706, 719

[56] References Cited

U.S. PATENT DOCUMENTS

| | | |
|---|---|---|
| 4,698,316 | 10/1987 | Corboy, Jr. . |
| 5,158,905 | 10/1992 | Ahn . |
| 5,254,503 | 10/1993 | Kenney . |
| 5,259,918 | 11/1993 | Akbar et al. . |
| 5,340,410 | 8/1994 | Endores et al. . |
| 5,346,846 | 9/1994 | Park et al. . |

FOREIGN PATENT DOCUMENTS

| | | |
|---|---|---|
| 0655 788 A1 | 5/1995 | European Pat. Off. . |
| 0 567 748 A1 | 11/1993 | Germany . |
| 6-232042 | 8/1994 | Japan . |
| 7-321053 | 12/1995 | Japan . |

OTHER PUBLICATIONS

Patent Abstracts of Japan, vol. 17, No. 295 (E–1377) Jun. 7, 1993, & JP 05–021798 dated Jan. 29, 1993.

Mine, T. et al, "Capacitance–Enhanced Stacked–Capacitor with Engraved Storage Electrode for Deep Submicron DRAMs", Japanese Journal of Applied Physics, (1989), pp. 137–140.

Sandip Tiwari et al, Volatile and Non–Volatile Memories in Silicon with Nano–Crystal Storage, Technical Digest of the International Electron Devices Meeting, (1995), pp. 521–524.

Garone et al., "Silicon vapor phase epitaxial growth catalysis by the presence of germane," Applied Physics Letters, vol. 56, p. 1275, 1990.

Maree et al., "Thin Film Ge–Si (111) Films: Study and Control of Morphology," Surface Science, vol. 191, p. 305, 1987.

Apetz. R. et al.: "Photoluminescence and Electroluminescence of SiGe Dots Fabricated by Island Growth," in *Appl. Phys. Lett* 66, Jan. 23, 1995, American Institute of Physics, pp. 445–447.

Eaglesham, D.J. et al.: "Dislocation–Free Stranski–Krastanow Growth of Ge on Si(100)," in *Physical Review Letters*, vol. 64, No. 16, Apr. 16, 1990, pp. 1943–1946.

Tiwari, Sandip et al.: "Volatile and Non–Volatile Memories in Silicon with Nano–Crystal Storage," in *IEDM 95*, pp. 521–525.

*Primary Examiner*—John F. Niebling
*Assistant Examiner*—Jonathan Hack
*Attorney, Agent, or Firm*—Hill & Simpson

[57] ABSTRACT

For manufacturing fine structures, nuclei that define the dimensions of the fine structures are formed on the surface of a substrate in a CVD process upon employment of a first process gas that contains $SiH_4$ and $GeH_4$ in a carrier gas. The nuclei can be employed both as a mask, for example, when etching or implanting, as will as active or passive component parts that remain in the structure, for example, as charge storages in the dielectric of an EEPROM.

5 Claims, 2 Drawing Sheets

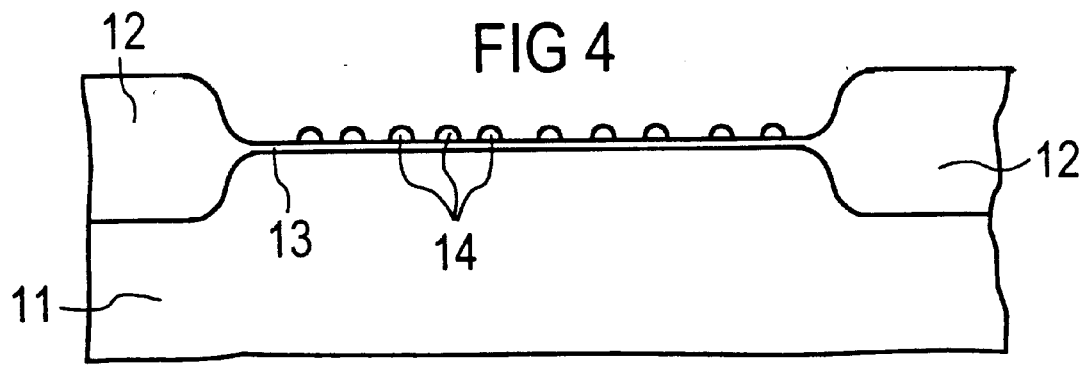
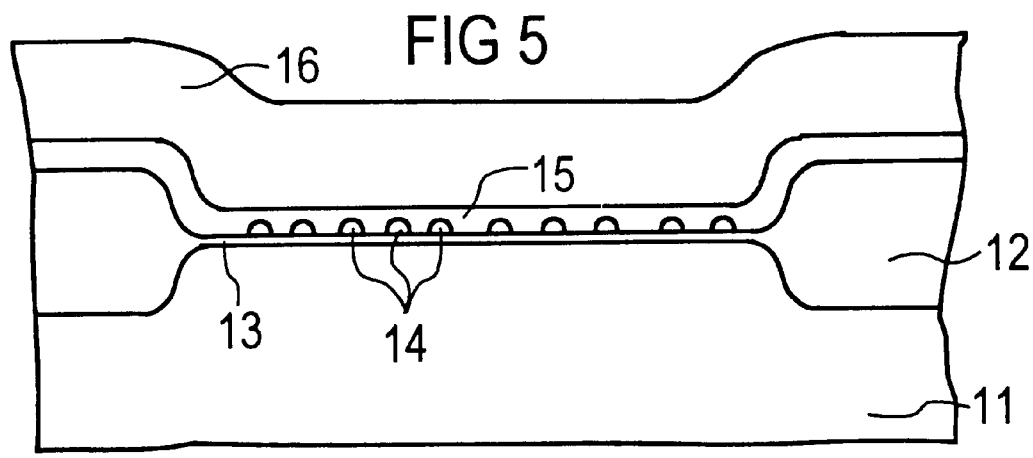
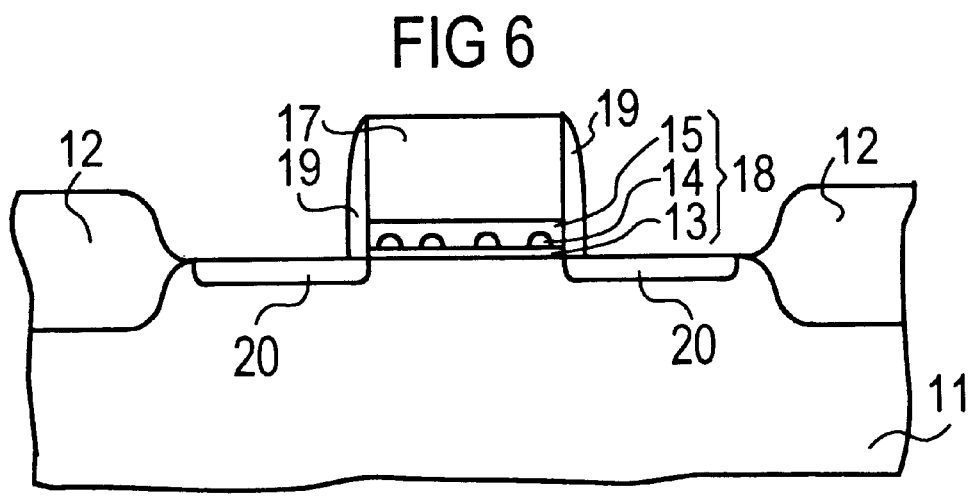

METHOD FOR MANUFACTURING FINE STRUCTURES

BACKGROUND OF THE INVENTION

The present invention generally relates to the manufacture of fine structures that is required in semiconductor technology for various applications.

In view of increasing miniaturization, masks with finer and finer structures are required in semiconductor technology. The masks are employed as etching masks or implantation masks.

Further, the manufacture of fine structures that remain as an active or passive component part in the component or in the arrangement to be manufactured is often required. This is true both of microelectronic components or arrangements as well as of micromechanical components or arrangements.

For example, such a component, which is suitable as volatile and non-volatile memory, has been proposed in an article entitled: "Volatile and Non-Volatile Memories in Silicon with Nano-Crystal Storage" (S. Tiwari et al., IEDM 95, pp. 521–524). As a memory cell, the component has a MOS transistor in whose gate dielectric includes what are referred to as silicon nano-crystals that are provided as charge storages. What are thereby involved are small silicon crystals having diameters of 5 nm that are embedded in a matrix of $SiO_2$. Charge is stored in these silicon crystals; this charge—similar to the stored charge on a floating gate of an EEPROM—influences the cutoff voltage of the MOS transistor. $SiO_2$ arranged under the silicon crystals thereby acts as tunnel oxide. The silicon crystals are formed by spontaneous decomposition and combination of materials in CVD depositions. Size and packing density of the arising silicon crystals are thereby difficult to control.

The present invention is, therefore, based on the problem of specifying a method for the manufacture of fine structures wherein the packing density of the fine structures can be set better. Over and above this, the size of the fine structures should also be adjustable.

SUMMARY OF THE INVENTION

To this end, the present invention provides a method for manufacturing fine structures. The method comprises the steps of: forming nuclei that define dimensions of the fine structures on a surface of a substrate in a CVD process upon employment of a first process gas that contains $SiH_4$ and $GeH_4$ in a carrier gas; interrupting the CVD process upon employment of the first process has as soon as the nuclei have reached a predetermined density; setting the size of the nuclei by selective epitaxy upon employment of a second process gas that contains $SiCl_2H_2$ and/or $GeH_4$ in the carrier gas.

In an embodiment, the first process gas contains $H_2$, $N_2$, Ar or He as the carrier gas.

In an embodiment, the nuclei have average diameters and average spacings, respectively, in a range between 1 and 100 nm.

In an embodiment, the method provides a substrate with a mask layer on whose surface the nuclei are formed and forms a mask layer by anisotropic etching upon employment of the nuclei as an etching mask.

In an embodiment, the method applies a first dielectric layer on whose surface the nuclei are formed and applies a second dielectric layer and a conductive layer are applied. The method further structures the conductive layer, the first dielectric layer and the second dielectric layer for forming a gate electrode and a gate dielectric of a MOS transistor in which the nuclei are arranged between the first dielectric layer and the second to form charges and forming a source region and a drain region for the MOS transistor in the substrate.

For manufacturing fine structures, nuclei that determine the dimensions of the fine structures are formed on the surface of a substrate in a CVD process upon employment of a first process gas that contains $SiH_4$ and $GeH_4$ in a carrier gas. Such nuclei are also referred to as nano-crystals. The nuclei arise statistically distributed without employment of lithographic processes. Smaller structure sizes that correspond to the resolution of the lithography can, therefore, be achieved.

The perception is thereby exploited that the addition of $GeH_4$ in a CVD deposition upon employment of a carrier gas that mainly contains $SiH_4$ in a carrier gas, for example $H_2$, retards the nucleus formation of silicon nuclei. The nucleus density can therefore be set via the addition of $GeH_4$. It was also found that the nucleus formation is additionally suppressed given employment of $H_2$ as a carrier gas. The nucleus formation preferably takes place at temperatures between 500° C. and 700° C.

The nucleus formation is interrupted as soon as a predetermined density of the nuclei has been reached. The size of the nuclei is subsequently set by selective epitaxy of silicon. A second process gas that contains $SiH_2Cl_2$ in a carrier gas, for example $H_2$, is employed therefor. The selective epitaxy occurs in a temperature range between 600° C. and 800° C. Over and above this, $GeH_4$ can be added to this gas mixture in order to set the material composition of the nuclei and, thus, material properties such as, for example, etching selectivities, work function and the like.

Preferably, the nuclei are formed with structure sizes in the range between 1 and 100 nm, i.e., the diameters of the nuclei lie in the range between 1 and 100 nm and the spacings between neighboring, statistically distributed mask structures likewise lie in this size range. Packing densities in the range between $10^8$ and $10^{13}$ per $cm^2$ are thus achieved.

It is, therefore, an advantage of the present invention to provide a substrate having a mask layer wherein the nuclei are formed on the surface thereof. A mask is subsequently formed from the mask layer by anisotropic etching upon employment of the nuclei as etching mask. The mask can be employed both as the etching mask as well as the implantation mask or the like. It exhibits structures with the size of the nuclei.

A further advantage of the present of the invention is to apply a first dielectric layer onto the substrate wherein the nuclei are formed on the surface of the first dielectric layer. A second dielectric layer and a conductive layer are applied thereon. The conductive layer, the first dielectric layer and the second dielectric layer are structured. A gate electrode and a gate dielectric of a MOS transistor are thereby formed. In the gate dielectric, the nuclei arranged between the first dielectric layer and the second dielectric layer form charge storages. A source region and a drain region for the MOS transistor are formed in the substrate.

The nuclei are thereby preferably formed of silicon/germanium. The work function can be set via the germanium part in the nuclei. A work function engineering is thus possible.

For example, a semiconductor substrate, preferably of monocrystalline silicon or an SOI substrate whose surface is provided with an insulating layer, is suitable as the substrate.

Additional features and advantages of the present invention are described in, and will be apparent from, the detailed description of the presently preferred embodiments and from the drawings.

BRIEF DESCRIPTION OF THE DRAWINGS

FIG. 4 illustrates a substrate with field oxide regions, a first dielectric layer and nuclei formed on the surface of the first dielectric layer.

FIG. 5 illustrates the substrate after application of a second dielectric layer and of a conductive layer.

FIG. 6 illustrates the substrate after formation of a gate electrode and of a gate dielectric as well as source and drain regions.

DETAILED DESCRIPTION OF THE PRESENTLY PREFERRED EMBODIMENTS

Figure 1:
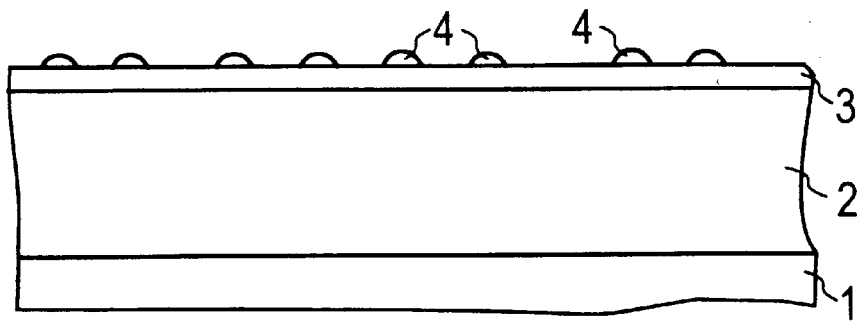
FIG. 1 illustrates a substrate with a layer to be structured and with a mask layer after formation of nuclei on the surface of the mask layer.

A layer 2 to be structured and composed of, for example, polysilicon, epitaxially grown silicon, metal, metal silicide, $SiO_2$, $Si_3N_4$ or the like is arranged on a substrate 1 of, for example, monocrystalline silicon. A mask layer 3 of a material that is suitable as an etching mask in the structuring of the layer 2 to be structured is arranged thereon. When the layer 2 to be structured is composed of silicon, then $SiO_2$, for example, is suitable for the mask layer 3 (see FIG. 1).

Statistically distributed nuclei 4 are formed on the surface of the mask layer 3 during a vapor phase deposition in an epitaxy system. An atmosphere of $H_2$ and $SiH_4$ is employed as a process gas, whereby $H_2$ forms the carrier gas. The atmosphere also comprises $GeH_4$ that is added for retarding the nucleation process. The partial pressure of $SiH_4$ and $GeH_4$ lies in the range from $10^{-3}$ through 1 mbar; the partial pressure of $H_2$ lies in the range from 1 through 100 mbar. The deposition is implemented in the temperature range between 500° C. and 700° C. Under these process conditions, individual nuclei 4 of silicon form at the surface of the mask layer 3. The nucleation process is terminated as soon as the number of the nuclei 4 has reached a predetermined density of about $10^{11}/cm^2$.

The process conditions are subsequently varied in order to designationally set the size of the nuclei 4. To that end, process conditions as used for selective epitaxy are set. A further nucleus formation at the surface of the mask layer 3 is suppressed under these process conditions. The selective epitaxy ensues, for example, with a gas mixture of $H_2$ and $SiH_2Cl_2$ in the temperature range between 600° C. and 800° C. Over and above this, $GeH_4$ can be added to this gas mixture in order to set the material composition of the nuclei 4 and, thus, material properties such as, for example, etching selectivities and the like.

The deposition process is terminated as soon as the diameter of the nuclei 4 corresponds to a predetermined value. The nuclei form a statistical mask.

Figure 2:
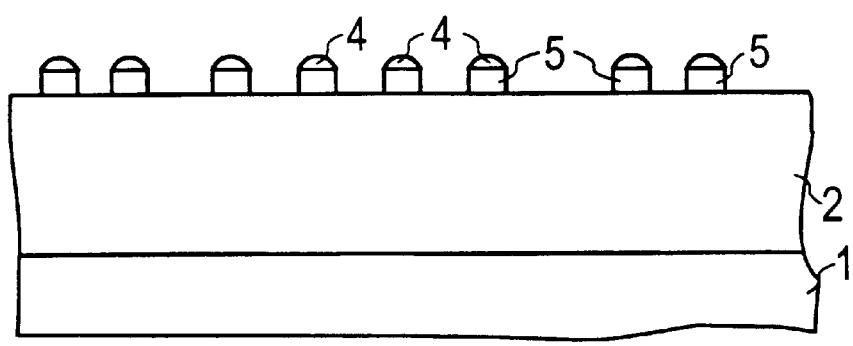
FIG. 2 illustrates a substrate after structuring of the mask layer upon employment of the nuclei as an etching mask.

The mask layer 3 is structured in an anisotropic etching process that attacks the mask layer 3 selectively relative to the nuclei 4. A mask 5 is thereby formed from the mask layer 3 (see FIG. 2).

Figure 3:
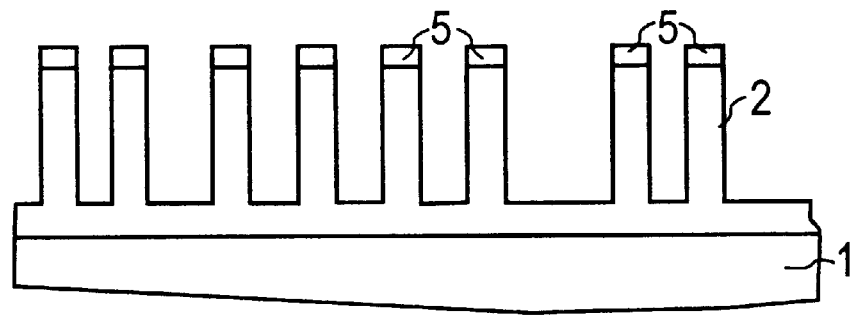
FIG. 3 illustrates a substrate after employment of the structured mask layer as the etching mask in the structuring of the layer to be structured.

An anisotropic etching process that attacks silicon selectively relative to $SiO_2$ is subsequently implemented. The layer 2 to be structured is thereby structured (see FIG. 3). At the same time, the nuclei, which are composed of silicon or silicon germanium, are removed. The anisotropic etching process is implemented with, for example, HBr.

Field oxide regions 12 that define an active zone for an MOS transistor are formed in a substrate 11 of, for example, monocrystalline silicon (see FIG. 4). The field oxide regions 12 are formed in, for example, a LOCOS process.

A first dielectric layer 13 of, for example, $SiO_2$ having a layer thickness of, for example, 3 nm is formed within the field oxide regions 12.

Statistically distributed nuclei 14 are formed on the surface of the first dielectric layer 13 during a vapor-phase deposition in an epitaxy system. An atmosphere of $H_2$ and $SiH_4$ is employed as process gas, whereby $H_2$ forms the carrier gas. The atmosphere also comprises $GeH_4$ that is added for retarding the nucleation process. The partial pressure of $SiH_4$ $GeH_4$ lies in the range from $10^{-3}$ through 1 mbar; the partial pressure of $H_2$ lies in the range from 1 through 100 mbar. The deposition is implemented in the temperature range between 500° C. and 700° C. Under these process conditions, the individual nuclei 14 of silicon form at the surface of the first dielectric layer 13. The nucleation process is terminated as soon as the density of the nuclei 14 has reached a predetermined density of about $10^8/cm^2$.

The process conditions are subsequently varied in order to designationally set the size of the nuclei 14. To that end, process conditions as used for selective epitaxy are set. A further nucleus formation at the surface of the first dielectric layer 13 is suppressed under these process conditions. The selective epitaxy ensues, for example, with a gas mixture of $H_2$ and $SiH_2Cl_2$ in the temperature range between 600° C. and 800° C. Over and above this, $GeH_4$ can be added to this gas mixture in order to set the material composition of the nuclei 14 and, thus, the work function.

The deposition process is terminated as soon as the diameter of the nuclei 14 corresponds to a predetermined value. The nuclei 14 are formed with a diameter of, for example, 5 nm and a surface density of, for example, $10^{12}$ $cm^{-2}$. The nuclei 14 form charge storages in the MOS transistor.

A second dielectric layer of, for example, $SiO_2$ having a layer thickness of, for example, 3 nm is deposited surface-wide (see FIG. 5). A conductive layer 16 of, for example, n-doped polysilicon is applied thereon. The conductive layer 16 is formed with a thickness of, for example, 150 nm.

Upon employment of photolithographic process steps, the conductive layer 16, the second dielectric layer 15 and the first dielectric layer 13 are subsequently structured. A gate electrode 17 and a gate dielectric 18 are thereby formed (see FIG. 6). The gate dielectric 18 has the structured, first dielectric layer 13 and the structured, second dielectric layer 15 as well as the nuclei 14 arranged therebetween. Nuclei arranged outside the gate dielectric 18 are likewise removed in the structuring.

By deposition of a $SiO_2$ layer with essentially conformal edge coverage and anisotropic re-etching, spacers 19 of $SiO_2$ are formed at the sidewalls of the gate electrode 17 and the gate dielectric 18.

Finally, source/drain regions 20 are formed self-aligned relative to the gate electrode 17 and the field oxide regions 12 by implantation of, for example, phosphorous or arsenic.

Dependent on the thickness of the first dielectric layer 13, the MOS transistor is suitable as volatile or non-volatile memory. The information is thereby stored in the form of a charge captured in the nuclei 14.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A method for manufacturing fine structures, the method comprising the steps of:

forming nuclei that define dimensions of the fine structures formed on a surface of a substrate in a CVD process upon employment of a first process gas that contains $SiH_4$ and $GeH_4$ in a carrier gas;

interrupting the CVD process upon employment of the first process gas as soon as the nuclei have reached a predetermined density; and setting the size of the nuclei by selective epitaxy upon employment of a second process gas that contains $SiCl_2H_2$ and/or $GeH_4$ in the carrier gas.

2. The method according to claim 1 wherein the first process gas contains $H_2$, $N_2$, Ar or He as the carrier gas.

3. The method according to claim 1 wherein the nuclei have average diameters and average spacings, respectively, in a range between 1 and 100 nm.

4. A method for manufacturing fine structures, the method comprising the steps of:

forming nuclei that define dimensions of the fine structures formed on a surface of a substrate in a CVD process upon employment of a first process gas that contains $SiH_4$ and $GeH_4$ in a carrier gas;

providing the substrate with a mask layer on whose surface the nuclei are formed;

forming a mask from the mask layer by anisotropic etching upon employment of the nuclei as an etching mask;

interrupting the CVD process upon employment of the first process gas as soon as the nuclei have reached a predetermined density; and setting the size of the nuclei by selective epitaxy upon employment of a second process gas that contains $SiCL_2H_2$ and/or $GeH_4$ in the carrier gas.

5. A method for manufacturing fine structures, the method comprising the steps of:

forming nuclei that define dimensions of the fine structures formed on a surface of a substrate in a CVD process upon employment of a first process gas that contains $SiH_4$ and $GeH_4$ in a carrier gas;

applying a first dielectric layer on whose surface the nuclei are formed onto the substrate;

applying a second dielectric layer and a conductive layer;

structuring the conductive layer and the first dielectric layer and the second dielectric layer for forming a gate electrode and a gate dielectric of a MOS transistor in which the nuclei are arranged between the first dielectric layer and the second dielectric layer to form charge storages; forming a source region and a drain region for the MOS transistor in the substrate;

interrupting the CVD process upon employment of the first process gas as soon as the nuclei have reached a predetermined density; and setting the size of the nuclei by selective epitaxy upon employment of a second process gas that contains $SiCL_2H_2$ and/or $GeH_4$ in the carrier gas.

\* \* \* \* \*